United States Patent
Li et al.

(10) Patent No.: US 9,532,142 B2
(45) Date of Patent: Dec. 27, 2016

(54) EMBEDDED SPEAKER PROTECTION FOR AUTOMOTIVE AUDIO POWER AMPLIFIER

(71) Applicants: STMicroelectronics (Shenzhen) R&D Co., Ltd., Shenzhen (CN); STMicroelectronics S.r.l, Agrate Brianza (IT)

(72) Inventors: XiangSheng Li, Shenzhen (CN); Cristiano Meroni, Milan (IT); Mei Yang, Shenzhen (CN); Xian Feng Xiong, Shenzhen (CN)

(73) Assignees: STMicroelectronics (Shenzhen) R&D Co., Ltd., Shenzhen (CN); STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/158,854

(22) Filed: May 19, 2016

(65) Prior Publication Data
US 2016/0269825 A1    Sep. 15, 2016

Related U.S. Application Data

(62) Division of application No. 14/754,861, filed on Jun. 30, 2015, now Pat. No. 9,386,372, which is a division of application No. 13/692,789, filed on Dec. 3, 2012, now Pat. No. 9,099,978.

(30) Foreign Application Priority Data

Dec. 30, 2011   (CN) .......................... 2011 1 0461473

(51) Int. Cl.
H04R 3/00    (2006.01)
H03G 11/00   (2006.01)
(Continued)

(52) U.S. Cl.
CPC ................ *H04R 3/007* (2013.01); *H03F 1/52* (2013.01); *H03F 3/183* (2013.01); *H03F 3/21* (2013.01);
(Continued)

(58) Field of Classification Search
CPC .. H03F 1/52; H03F 2200/78; H03F 2200/321; H03F 2200/375; H03F 2200/471; H03F 2200/03; H03F 3/21; H03F 3/72; H03F 3/183; H03F 3/181; H03F 3/45475; H03F 2203/7227; H03G 3/348; H03G 3/342; H03G 3/30; H03G 11/00; H04R 2201/028; H04R 3/00; H04R 1/00; H04R 3/007
See application file for complete search history.

(56) References Cited

U.S. PATENT DOCUMENTS 4,034,268 A    7/1977   Klauck
4,301,330 A   11/1981   Trump
(Continued)

FOREIGN PATENT DOCUMENTS

CN      1684359 A    10/2005
CN    201910249 U     7/2011
CN    202799077 U     3/2013

Primary Examiner — Thang Tran
(74) Attorney, Agent, or Firm — Slater Matsil, LLP

(57) ABSTRACT

A digital circuit can be used in a speaker system. An intermediate node provides a speaker protection control signal. A first latch for receives an offset control signal. A first logic gate receives a play control signal, the offset control signal, and the speaker protection control signal. A second logic gate is coupled to the first latch for receiving the play control signal and the speaker protection control signal. A second latch is coupled to the first logic gate for providing a forced mute signal. A third latch is coupled to the second logic gate and to the intermediate node.

20 Claims, 4 Drawing Sheets

(51) Int. Cl.
*H03F 1/52* (2006.01)
*H03G 3/34* (2006.01)
*H03F 3/21* (2006.01)
*H03F 3/183* (2006.01)
*H04R 1/00* (2006.01)

(52) U.S. Cl.
CPC .............. *H03G 3/348* (2013.01); *H03G 11/00* (2013.01); *H04R 1/00* (2013.01); *H03F 2200/321* (2013.01); *H03F 2200/375* (2013.01); *H03F 2200/471* (2013.01); *H03F 2200/78* (2013.01); *H04R 2201/028* (2013.01); *H04R 2499/13* (2013.01)

(56) References Cited

U.S. PATENT DOCUMENTS

| | | | |
|---|---|---|---|
| 4,313,033 A * | 1/1982 | Walker | H04M 3/561 370/259 |
| 5,063,597 A * | 11/1991 | Seo | H03G 3/348 704/226 |
| 5,381,186 A * | 1/1995 | Lee | H04N 5/607 348/466 |
| 5,815,584 A | 9/1998 | Whitecar et al. | |
| 7,692,488 B2 | 4/2010 | Wong et al. | |
| 8,243,968 B2 | 8/2012 | Suzuki | |
| 8,965,006 B2 | 2/2015 | Hung et al. | |
| 2002/0149422 A1 | 10/2002 | Vermeeren | |
| 2003/0072462 A1* | 4/2003 | Hlibowicki | H04R 3/007 381/96 |
| 2003/0160653 A1 | 8/2003 | Hasegawa | |
| 2005/0093622 A1* | 5/2005 | Lee | H03F 1/523 330/10 |
| 2007/0064953 A1* | 3/2007 | Ishida | H03G 3/342 381/55 |
| 2008/0008330 A1 | 1/2008 | Tseng | |
| 2009/0103750 A1 | 4/2009 | Chilakapati et al. | |
| 2009/0219090 A1 | 9/2009 | Wong et al. | |
| 2011/0055877 A1 | 3/2011 | Lesso | |
| 2011/0206224 A1 | 8/2011 | Augustyn et al. | |
| 2012/0154032 A1 | 6/2012 | Lesso | |
| 2013/0089223 A1* | 4/2013 | Heineman | H03G 1/04 381/120 |

* cited by examiner

EMBEDDED SPEAKER PROTECTION FOR AUTOMOTIVE AUDIO POWER AMPLIFIER

CROSS-REFERENCE TO RELATED APPLICATIONS

This is a division of U.S. application Ser. No. 14/754,861, filed Jun. 30, 2015 (now U.S. Pat. No. 9,386,372), which is a division of U.S. application Ser. No. 13/692,789, filed Dec. 3, 2012 (now U.S. Pat. No. 9,099,978), which claims the priority benefit of Chinese patent application number 201110461473.8, filed on Dec. 30, 2011, each of which is hereby incorporated by reference to the maximum extent allowable by law.

TECHNICAL FIELD

The present invention relates to audio speaker protection, and, more particularly to an embedded speaker protection method and circuit embodiment thereof for an automotive audio power amplifier, which can protect the speakers automatically in case of high offset during a turn-on procedure.

BACKGROUND

In automotive power amplifier devices an offset detector function is normally embedded. Any DC output offset exceeding .+−0.2V is signalled out no matter if there is an input signal or not. This abnormal offset, when there is no input signal, might occur as a consequence of initially defective or aged and worn-out input capacitors feeding a DC component to the input. The abnormal offset can put the speakers at risk of overheating, or damage the speakers directly.

In current applications of automotive audio power amplifiers, if an audio system is to protect the speakers in case of high output offset, an MCU (microprocessor) must first read the offset detector outputs from the amplifier, and put the amplifier in a mute mode if a high offset is detected. All these actions require extra MCU operations and are controlled outside of the power amplifier IC.

To read the information given by the power amplifier (for example in the TDA7563B quad power amplifier) the diagnosis has to be performed with a low-level output AC signal (or Vin=0). An MCU enables the offset detection by setting an I²C command IB1D<5>=1 and then reads the status of the amplifier after a selectable testing time. An excess offset greater than +/−2V is signalled out if it is persistent throughout the assigned testing time. The MCU then can decide to turn off or mute the power amplifier, or just do nothing.

If the MCU ignores all the operations described above, the power amplifier may maintain play mode with a high offset feeding to the speakers without any protections, which is undesirable for the reasons given above.

Referring now to FIG. 1, a flow chart 100 shows the turn-on sequence for the prior art amplifier described above. An MCU enables the offset detection, and sets the IBID<5> bit to a logic one at step 102. The MCU then reads the offset status at step 104. A decision block 106 asks whether or not the offset read is greater than two volts. If no, then the audio amplifier maintains its current working state at step 108. If yes, then the MCU sends a mute command to the amplifier, or simply turns the amplifier off at step no.

Referring now to FIG. 2, a plot of the voltage at the two speaker output terminals 202 and 204 is shown in a turn-on procedure in the case of an abnormal offset without MCU intervention according to the prior art. The step function in traces 202 and 204 are caused by the abnormal offset in the speaker system.

What is desired is a more direct method and corresponding circuit apparatus for providing the prior art functionality more quickly, and without incurring the extra MCU cycles described above.

SUMMARY

According to the present invention a method of operating a speaker system including a speaker coupled to an amplifier, and a dedicated digital speaker protection circuit comprises turning on the amplifier in a mute mode, after a first delay period, issuing a play command to the amplifier to place the amplifier in a play mode, but without an input signal during a second delay period, and performing a speaker offset detection during the second delay period, wherein, if there is an offset, then the amplifier is forced back into the mute mode, and if there is no offset, then the amplifier is allowed to continue to operate in the play mode. A microprocessor issues a command to place the amplifier in the mute and play modes. The first delay period is about a second. And the second delay period is about 100 milliseconds. Forcing the amplifier back into the mute mode is accomplished by the dedicated digital circuit associated with the amplifier. The offset detection comprises a detection of a threshold offset greater than about two volts. The method of the present invention further comprises issuing a speaker protection control signal or command if an offset is detected.

A speaker system according to the present invention comprises a speaker coupled to an amplifier, an offset comparator coupled to the speaker for providing an offset control signal, a digital circuit having a first input coupled to an output of the offset comparator, a second input for receiving an amplifier control signal, a third input for receiving a play control signal, and an output for providing a forced mute signal, and a microprocessor for controlling the amplifier.

The digital circuit comprises an intermediate node for providing a speaker protection control signal, a first latch for receiving the offset control signal, a first logic gate for receiving the play control signal, the offset control signal, and the speaker protection control signal, a second logic gate coupled to the first latch for receiving the play control signal and the speaker protection control signal, a second latch coupled to the first logic gate for providing the forced mute signal, and a third latch coupled to the second logic gate and to the intermediate node. The first, second, and third latches are clocked by the amplifier control signal. The first, second, and third latches comprise D-type flip flops. The first and second logic gates comprise three-input NAND gates.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

According to the present invention, a speaker protection function is embedded inside the power amplifier device itself, by means of a dedicated digital circuit.

Figure 1:
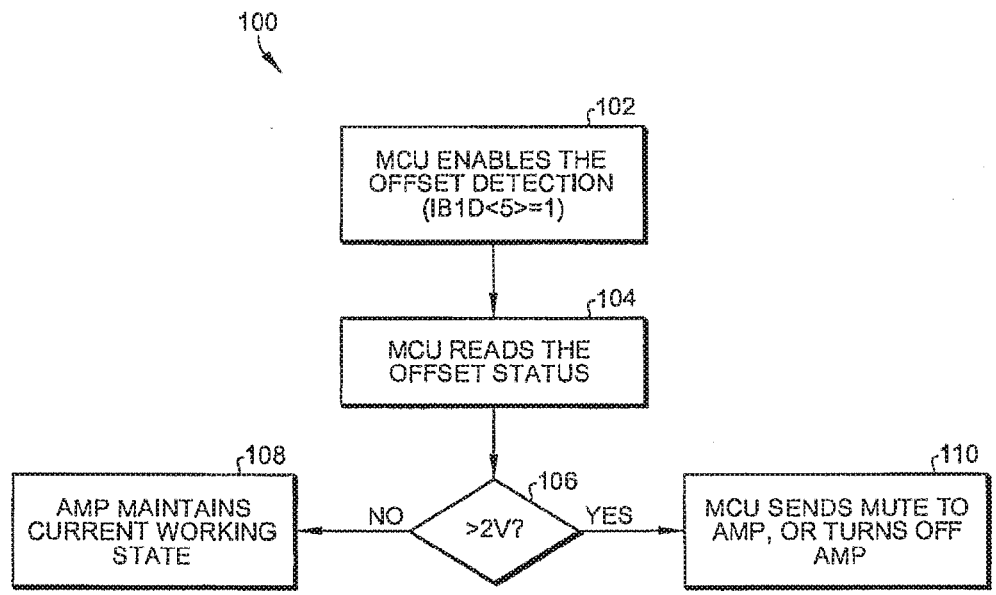
FIG. 1 is a flowchart of a speaker protection procedure according to the prior art.
Figure 2:
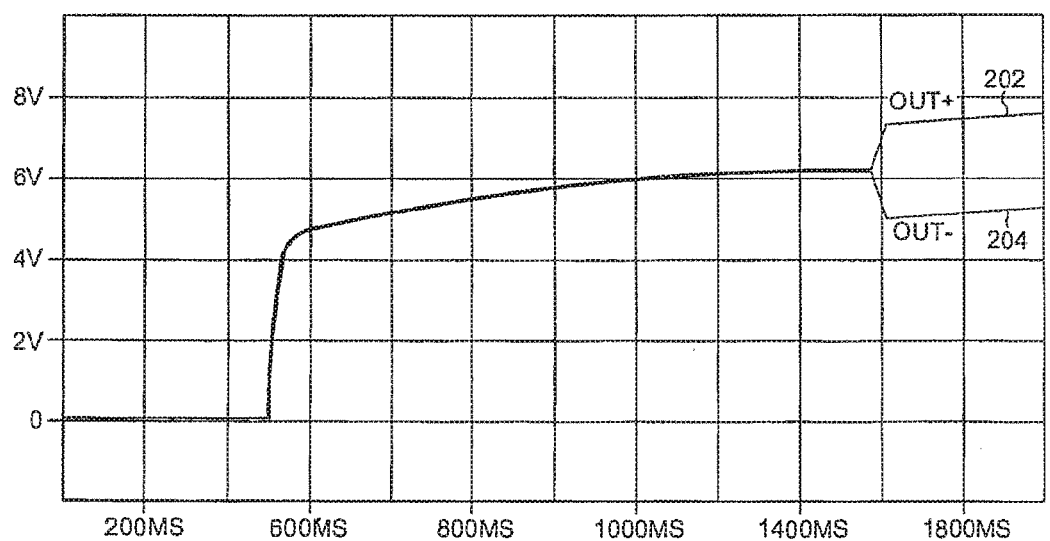
FIG. 2 is a plot of the voltage at the two speaker output terminals in a turn-on procedure in the case of an abnormal offset without MCU intervention according to the prior art.
Figure 3A:
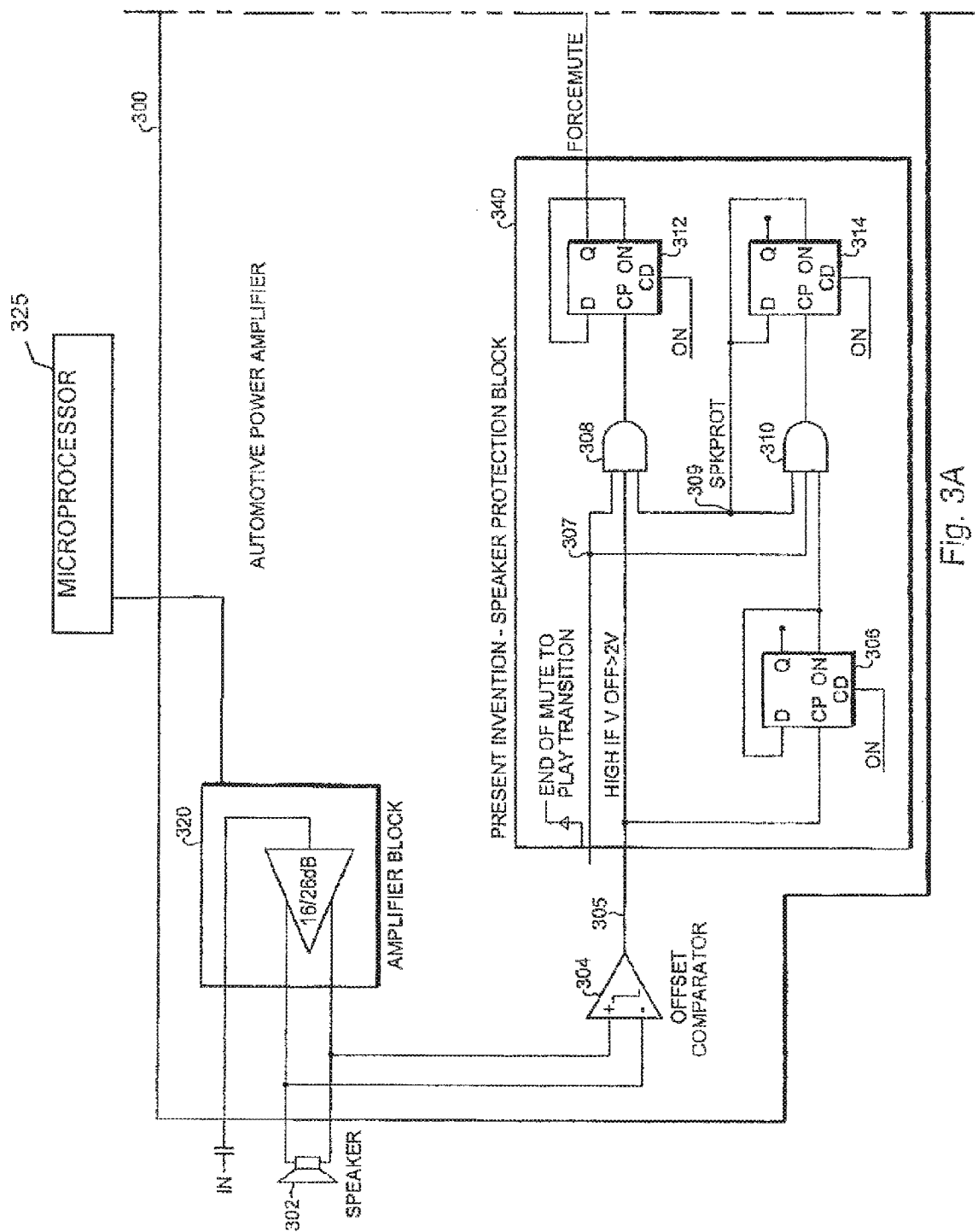
FIGS. 3A and 3B taken together is a simplified circuit diagram for a dedicated digital speaker protection according to the present invention.
Figure 3B:
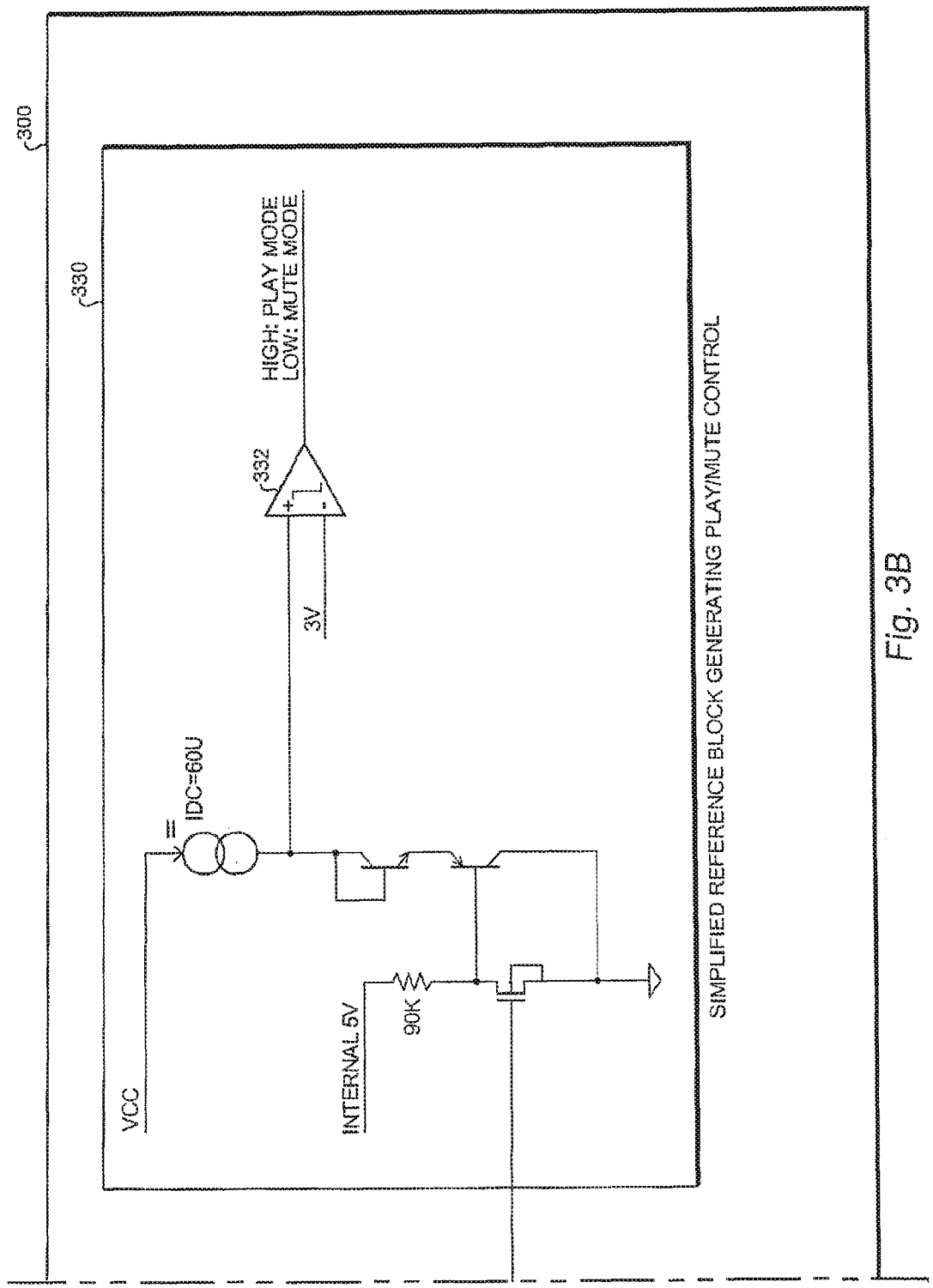

A simplified circuit diagram for the digital circuit 340 that provides the speaker protection function is shown in FIGS. 3A and 3B, which is split into two parts for sake of clarity. The flip-flop enabling signal ON goes high when the amplifier is turned on. The FORCEMUTE signal goes to the reference block 330 to control the mute state of the whole amplifier 320. In the reference block 330, if FORCEMUTE is high, a low output is provided by the play/mute comparator 332.

A speaker system 300 includes a speaker 302 coupled to an amplifier, an offset comparator 304 coupled to the speaker for providing an offset control signal at node 305, a digital circuit (306, 308, 310, 312, 314) having a first input coupled to an output of the offset comparator 304, a second input for receiving an amplifier control signal (ON), a third input for receiving a play control signal at node 307, and an output for providing a forced mute signal (FORCEMUTE), and a microprocessor (MCU) for controlling the amplifier.

The digital circuit includes an intermediate node 309 for providing a speaker protection control signal (SPKPROT), a first latch 306 for receiving the offset control signal at node 305, a first logic gate 308 for receiving the play control signal at node 307, the offset control signal at node 305, and the speaker protection control signal SPKPROT, a second logic gate 310 coupled to the first latch 306 for receiving the play control signal and the speaker protection control signal, a second latch 312 coupled to the first logic gate 308 for providing the forced mute signal FORCEMUTE, and a third latch 314 coupled to the second logic gate 310 and to the intermediate node 309.

The first, second, and third latches 306, 312, and 314 are D-type flip-flops clocked by the amplifier control signal (ON), wherein the inverted Q output is coupled to the D-input. CP is the positive edge triggered clock input and CD is the clear active low input, which clears the output when it is low. The first and second logic gates 308, 310 are three-input NAND gates.

The speaker protection method of the present invention is described below.

The power amplifier generates two internal signals, namely SPKPROT and FORCEMUTE.

The MCU turns on the amplifier in mute mode, and SPKPROT signal is latched high.

After about one second, the MCU sends a PLAY command to the amplifier, and makes sure no signal is applied to the inputs of the amplifier for about 100 ms.

After the MUTE to PLAY transition time (which is about 40 ms) the amplifier checks the output offset status using internal comparators.

If there is high offset and SPKPROT=1, FORCEMUTE is latched high and the amplifier forces itself back into MUTE mode, and SPKPROT remains at a logic one. A bit of an I²C bus output is set to a logic one to inform the speaker system that the speaker protection is triggered. The MUTE mode is locked and can be reset only when MCU turns off the amplifier by the I²C bus.

If there is no offset greater than two volts, and SPKPROT=1, FORCEMUTE is latched low which allows amplifier to work in PLAY mode and SPKPROT is reset to a logic zero, which keeps the new speaker protection function inactive in order not to mute the output in case an input signal is applied.

The new embedded speaker protection according to the present invention requires the MCU to turn on the audio power amplifier in a proper sequence. The MCU should first turn on the device in MUTE condition and, after a suitable time for the device to fully work, send a PLAY command to the device and make sure there is no input signal applied to any of the inputs for at least 100 ms.

If the MCU turns on the amplifier directly to play mode without enough setting time for the amplifier to be stable, the speaker protection mechanism of the present invention may not work.

If there is external signal applied to any of the amplifier inputs during this turn-on phase, the new speaker protection mechanism may give an improper mute instruction to the amplifier itself.

Figure 4:
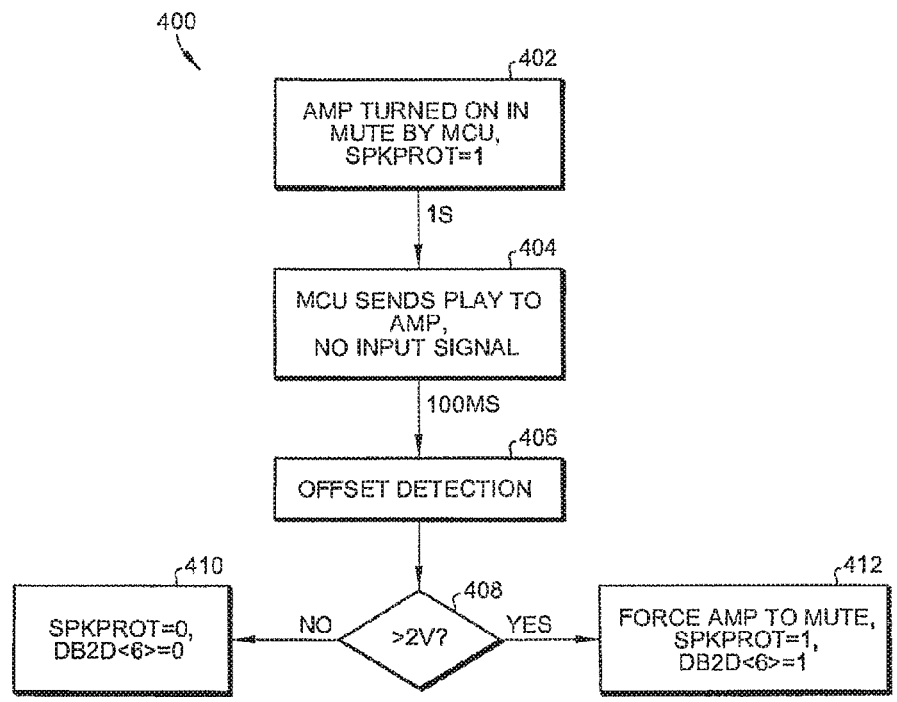
FIG. 4 is a flowchart of a speaker protection procedure according to the present invention.

Referring now to FIG. 4, the method 400 of operating a speaker system including a speaker coupled to an amplifier, comprises turning on the amplifier in a mute mode 402, after a first delay period, issuing a play command to the amplifier to place the amplifier in a play mode, but without an input signal during a second delay period 404, and performing a speaker offset detection 406 during the second delay period, wherein, if there is an offset, then the amplifier is forced back into the mute mode 412, and if there is no offset, then the amplifier is allowed to continue to operate in the play mode 410. A microprocessor issues a command to place the amplifier in the mute mode and the play mode. Forcing the amplifier back into the mute mode is accomplished by the dedicated digital circuit in the amplifier, which is shown in FIG. 3. The offset detection comprises a detection of a threshold offset greater than about two volts. The method of the present invention further comprises issuing a speaker protection control signal or command if an offset is detected.

Figure 5:
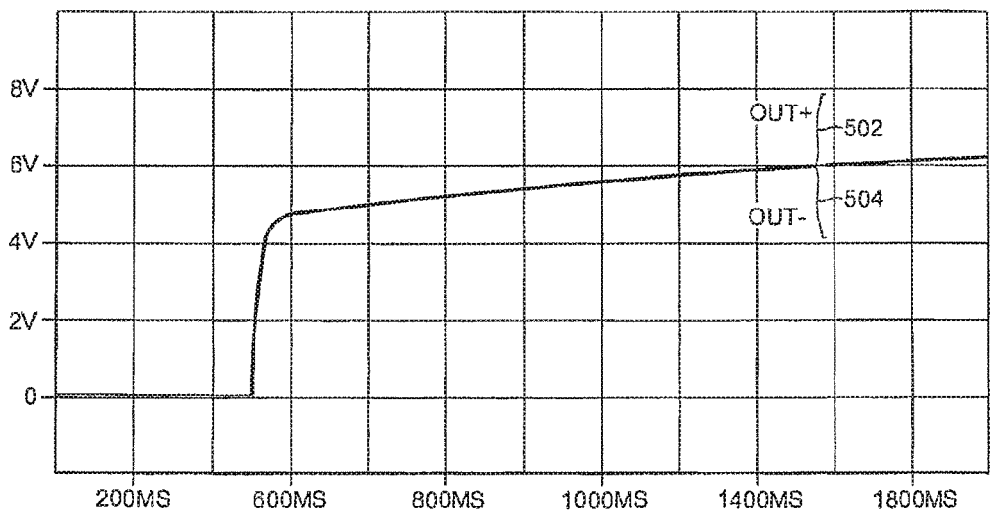
FIG. 5 is a plot of the voltage at the two speaker output terminals in which the amplifier is quickly muted after the detection of a high offset condition, according to the present invention.

The results of the speaker protection method of the present invention is verified in FIG. 5, which shows that the device is set to PLAY about one second after turn-on. After the MUTE to PLAY transition the device detects a high offset which is above two volts and then mutes itself. Note that speaker output terminals 502 and 504 show a glitch when the offset is detected, which is quickly suppressed before any damage can occur to the speaker (or speakers).

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A digital circuit for use in a speaker system comprising:
   an intermediate node for providing a speaker protection control signal;
   a first latch for receiving an offset control signal;
   a first logic gate for receiving a play control signal, the offset control signal, and the speaker protection control signal;

a second logic gate coupled to the first latch for receiving the play control signal and the speaker protection control signal;
a second latch coupled to the first logic gate for providing a forced mute signal; and
a third latch coupled to the second logic gate and to the intermediate node.

2. The digital circuit of claim 1, wherein the first, second, and third latches are each controlled by a common amplifier control signal.

3. The digital circuit of claim 1, wherein the first, second, and third latches each comprise a D-type flip flops.

4. The digital circuit of claim 3, wherein each D-type flip flop comprises an inverted output coupled to a D input.

5. The digital circuit of claim 1, wherein the first logic gate and the second logic gate each comprise a three-input NAND gate.

6. The digital circuit of claim 1, wherein the first logic gate and the second logic gate each comprise a three-input AND gate.

7. The digital circuit of claim 1, wherein the digital circuit is embedded in a power amplifier device.

8. A speaker system comprising the digital circuit of claim 1, the system further comprising:
a speaker;
a power amplifier device coupled to the speaker, wherein the digital circuit is embedded in the power amplifier device; and
an offset comparator coupled to the speaker for providing the offset control signal.

9. An integrated circuit comprising:
a play control signal input node;
an offset indication input node;
a mute control output node;
an intermediate node;
a first latch with an input coupled to the offset indication input node;
a first comparison circuit with an output coupled to the mute control output node, the first comparison circuit having inputs coupled to the play control signal input node, the offset indication input node, and the intermediate node; and
a second comparison circuit with an output coupled to the intermediate node, the second comparison circuit having inputs coupled to the play control signal input node, an output of the first latch, and the intermediate node.

10. The integrated circuit of claim 9, wherein integrated circuit is configured for use in a speaker system and wherein the intermediate node is configured to carry a speaker protection control signal.

11. The integrated circuit of claim 9, wherein the first comparison circuit comprises a first logic gate and wherein the second comparison circuit comprises a second logic gate.

12. The integrated circuit of claim 11, wherein the first comparison circuit further comprises a second latch coupled to an output of the first logic gate and wherein the second comparison circuit further comprises a third latch coupled to an output of the second logic gate.

13. The integrated circuit of claim 12, wherein the first, second, and third latches are each controlled by a common amplifier control signal.

14. The integrated circuit of claim 13, wherein the first, second, and third latches each comprise D-type flip flop.

15. The integrated circuit of claim 14, wherein each D-type flip flop comprises an inverted output coupled to a D input.

16. The integrated circuit of claim 11, wherein the first logic gate and the second logic gate each comprise a three-input NAND gate.

17. The integrated circuit of claim 9, wherein the integrated circuit is embedded inside a power amplifier device.

18. A speaker system comprising the integrated circuit of claim 9, the system further comprising:
a power amplifier device; and
an offset comparator coupled between the power amplifier device and an offset indication input node.

19. The system of claim 18, further comprising a speaker with an input coupled to an output of the power amplifier device.

20. A digital circuit for controlling operation of a speaker system that includes a speaker coupled to an amplifier, the digital circuit comprising:
means for generating a speaker offset detection signal;
means for generating a speaker control signal based upon the speaker offset detection signal, a play control signal and an earlier value of the speaker control signal; and
means for generating a force mute signal based on the speaker offset detection signal, the play control signal and the generated speaker control signal.

* * * * *